US 12,416,661 B2

(12) United States Patent
Zhao et al.

(10) Patent No.: US 12,416,661 B2
(45) Date of Patent: Sep. 16, 2025

(54) DEVICE FOR SIMULATING HIGH-FREQUENCY CURRENT PROPAGATION OF PARTIAL DISCHARGE OF GIL/GIS

(71) Applicants: STATE GRID JIANGSU ELECTRIC POWER RESEARCH INSTITUTE, Jiangsu (CN); STATE GRID JIANGSU ELECTRIC POWER CO., LTD., Jiangsu (CN); JIANGSU ELECTRIC POWER RESEARCH INSTITUTE CO., LTD., Jiangsu (CN)

(72) Inventors: Ke Zhao, Jiangsu (CN); Jingtan Ma, Jiangsu (CN); Jinggang Yang, Jiangsu (CN); Qiang Huang, Jiangsu (CN); Jianjun Liu, Jiangsu (CN); Shan Gao, Jiangsu (CN); Shaobo Chen, Jiangsu (CN); Hongtao Li, Jiangsu (CN); Yang Xu, Jiangsu (CN); Zhaohui Zhang, Jiangsu (CN); Yujie Li, Jiangsu (CN); Rong Sun, Jiangsu (CN); Yongfei Liu, Jiangsu (CN); Hanyan Xiao, Jiangsu (CN); Tianxin Zhuang, Jiangsu (CN)

(73) Assignees: STATE GRID JIANGSU ELECTRIC POWER RESEARCH INSTITUTE (CN); STATE GRID JIANGSU ELECTRIC POWER CO. LTD. (CN); JIANGSU ELECTRIC POWER RESEARCH INSTITUTE CO., LTD. (CN)

( * ) Notice: Subject to any disclaimer, the term of this patent is extended or adjusted under 35 U.S.C. 154(b) by 0 days.

(21) Appl. No.: 18/556,847

(22) PCT Filed: Jun. 16, 2022

(86) PCT No.: PCT/CN2022/099119
§ 371 (c)(1),
(2) Date: Oct. 23, 2023

(87) PCT Pub. No.: WO2023/142339
PCT Pub. Date: Aug. 3, 2023

(65) Prior Publication Data
US 2025/0067787 A1    Feb. 27, 2025

(30) Foreign Application Priority Data
Jan. 28, 2022    (CN) ......................... 202210109112.5

(51) Int. Cl.
*G01R 31/00*    (2006.01)
*G01R 31/12*    (2020.01)
*G01R 31/327*    (2006.01)

(52) U.S. Cl.
CPC ..... *G01R 31/1254* (2013.01); *G01R 31/1272* (2013.01); *G01R 31/3274* (2013.01)

(58) Field of Classification Search
CPC .. G01R 31/001; G01R 31/12; G01R 31/1254; G01R 31/1272; G01R 31/3274; Y02E 60/00
See application file for complete search history.

(56) References Cited

U.S. PATENT DOCUMENTS

| 4,882,682 A | * | 11/1989 | Takasuka | G01R 31/083 324/544 |
| 5,146,170 A | * | 9/1992 | Ishikawa | G01R 31/1254 324/520 |

(Continued)

*Primary Examiner* — Thang X Le

(57) ABSTRACT

A device for simulating high-frequency current propagation of partial discharge of a GIL/GIS is disclosed. The device comprises a casing, a busbar cavity, an adjustable impedor, a first metal support, a second metal support, a third metal support, and a high-frequency current sensor. The first metal support and the second metal support are separated by an insulating support, the third metal support has an end connected to the second metal support, as well as an end (Continued)

connected to a grounding grid, and the adjustable impedor is formed by an adjustable resistor and an adjustable inductor which are connected in series, and is connected in series between the first metal support and the second metal support through a wire. In the application, the adjustable impedor is connected in series to the metal supports at the grounding point to obtain an impedance equivalent to that of a long-distance GIL/GIS housing.

10 Claims, 2 Drawing Sheets

(56) References Cited

U.S. PATENT DOCUMENTS

| | | | | |
|---|---|---|---|---|
| 5,214,595 A * | 5/1993 | Ozawa | ............... | G01R 15/142 |
| | | | | 706/916 |
| 6,333,715 B1 * | 12/2001 | Kato | ............... | G01R 31/1272 |
| | | | | 324/536 |
| 6,661,235 B2 * | 12/2003 | Rokunohe | .......... | G01R 31/1272 |
| | | | | 324/552 |

\* cited by examiner

DEVICE FOR SIMULATING HIGH-FREQUENCY CURRENT PROPAGATION OF PARTIAL DISCHARGE OF GIL/GIS

FIELD

The application relates to the technical field of simulation of high-frequency current of partial discharge, in particular to a device for simulating high-frequency current propagation of partial discharge of a GIL/GIS.

BACKGROUND

Gas insulated switchgears (GISs) and gas insulated-transmission lines (GILs) have the advantages of occupying a small space and being small in size, high in reliability and easy to maintain, thus being widely applied to high-voltage power transmission and transformation systems of urban power grids, power plants, large industrial and mining enterprises. With the development of the power system, more and more long-distance GILs/GISs are used in the power transmission and transformation field.

Some insulation defects will be inevitably caused in the delivery, transportation and operation process of GILs/GISs, leading to partial electric field distortion. When the electric field intensity reaches the breakdown field intensity, partial discharge will happen in equipment. The high-frequency current method, as a partial discharge detection technique easy to operate, has a good application prospect in site. The attenuation of high-frequency current in the propagation process has a great impact on detection effectiveness. So, it is necessary to study the propagation characteristics of high-frequency current in GILs/GISs.

At present, a test section of GILs/GISs used for experimental study often has a limited size, which makes it hard to simulate the propagation of high-frequency current signals of partial discharge in long-distance GILs/GISs, and the use of a large-sized and long-distance test section will result in a high cost.

SUMMARY

The application discloses a device for simulating high-frequency current propagation of partial discharge of a GIL/GIS to solve the technical problems that, in the prior art, a test section of GILs/GISs used for experimental study often has a limited size, which makes it hard to simulate the propagation of high-frequency current signals of partial discharge in long-distance GILs/GISs, and that the use of a large-sized and long-distance test section will result in a high cost.

The application discloses a device for simulating high-frequency current propagation of partial discharge of a GIL/GIS, comprising a casing, a busbar cavity, an adjustable impedor, a first metal support, a second metal support, a third metal support, and a high-frequency current sensor;
the casing is connected to the busbar cavity, a conductor is arranged in the busbar cavity, and the busbar cavity is provided with multiple air vents;
the first metal support and the second metal support are arranged at a grounding point of the busbar cavity and are separated from each other by an insulating support, and the adjustable impedor is connected in series between the first metal support and the second metal support through a wire; the third metal support has an end connected to the second metal support, as well as an end connected to a grounding grid;
the high-frequency current sensor is disposed around the wire.

Optionally, the adjustable impedor is formed by an adjustable resistor and an adjustable inductor which are connected in series, the adjustable resistor is connected to the first metal support, and the adjustable inductor is connected to the second metal support.

Optionally, the casing and the busbar cavity are connected through a flange.

Optionally, the busbar cavity comprises multiple air chambers.

Optionally, insulators are arranged at joints of the air chambers.

Optionally, the air vents are formed in side faces of the air chambers.

Optionally, the casing is connected to a partial discharge-free power-frequency testing transformer.

Optionally, multiple pulleys are arranged at a bottom of the third metal support.

Optionally, the adjustable resistor is a non-wire-wound potentiometer.

Optionally, the adjustable inductor is a coil with a variable core position.

The application relates to the technical field of simulation of high-frequency current of partial discharge, and discloses a device for simulating high-frequency current propagation of partial discharge of a GIL/GIS, comprising a casing, a busbar cavity, an adjustable impedor, a first metal support, a second metal support, a third metal support, and a high-frequency current sensor. The first metal support and the second metal support are separated by an insulating support, the third metal support has an end connected to the second metal support, as well as an end connected to a grounding grid, and the adjustable impedor is formed by an adjustable resistor and an adjustable inductor which are connected in series, and is connected in series between the first metal support and the second metal support through a wire. In the application, the adjustable impedor is connected in series to the metal supports at the grounding point to obtain an impedance equivalent to that of a long-distance GIL/GIS housing. When partial discharge happens in the busbar cavity, high-frequency current passes through the adjustable impedor, which is equivalent to passing through a GIL/GIS housing with a length equivalent to the impedance of the impedor, thus fulfilling the purpose of simulating high-frequency current propagation of partial discharge of a long-distance GIL/GIS. The simulation process is simple and quick, and time and costs are reduced.

BRIEF DESCRIPTION OF THE DRAWINGS

To more clearly explain the technical solutions of the application, drawings for some embodiments of the invention will be briefly introduced below. Obviously, those ordinarily skilled in the art can obtain other drawings according to the following ones without creative labor.

REFERENCE SIGNS

In the figures: 1, casing; 2, flange; 3, conductor; 4, insulator; 5, air vent; 6, first metal support; 7, insulating support; 8, second metal support; 9, third metal support; 10, pulley; 11, adjustable impedor; 111, adjustable resistor; 112, adjustable inductor; 12, wire; 13, high-frequency current sensor.

DETAILED DESCRIPTION

To solve the technical problems that, in the prior art, a test section of GILs/GISs used for experimental study often has a limited size, which makes it hard to simulate the propagation of high-frequency current signals of partial discharge in long-distance GILs/GISs, and that the use of a large-sized and long-distance test section will result in a high cost, the application provides a device for simulating high-frequency current propagation of partial discharge of a GIL/GIS.

Figure 1:
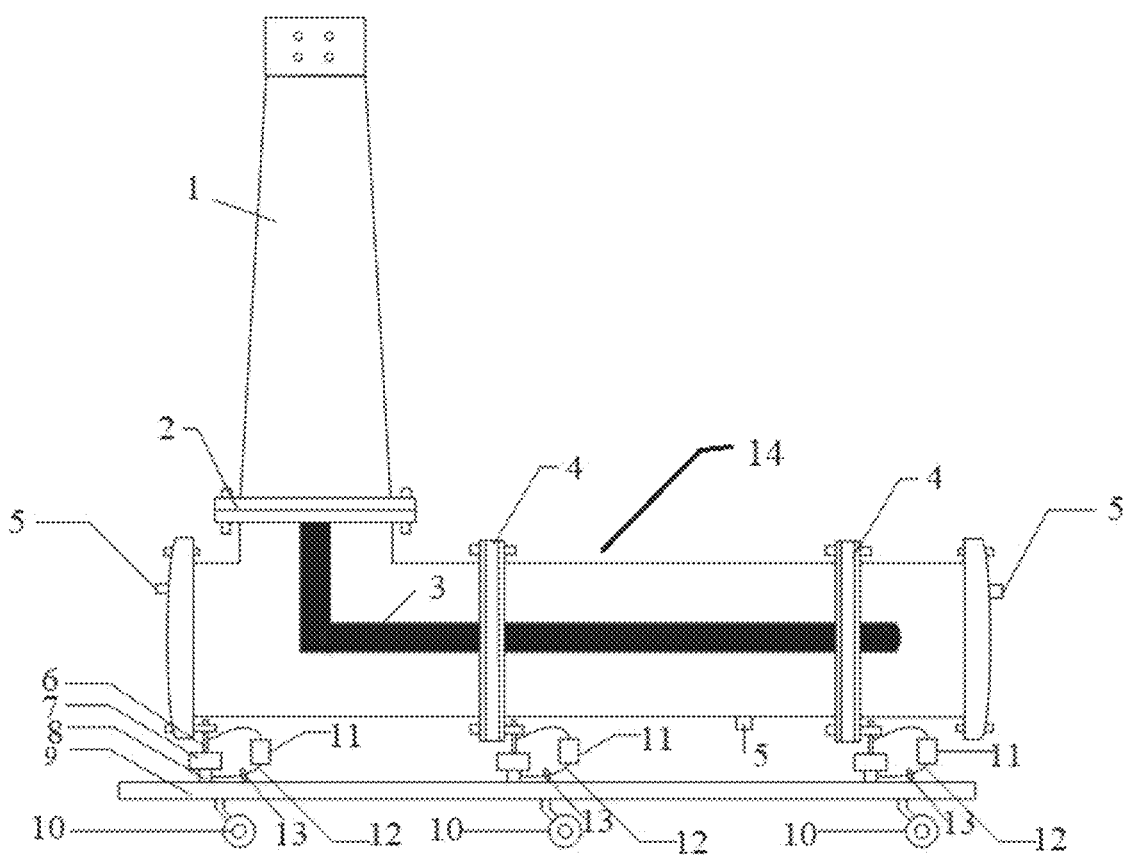
FIG. 1 is a structural view of a device for simulating high-frequency current propagation of partial discharge of a GIL/GIS according to an embodiment of the application.

Referring to FIG. 1 which is a structural view of a device for simulating high-frequency current propagation of partial discharge of a GIL/GIS according to an embodiment of the application, the device for simulating high-frequency current propagation of partial discharge of a GIL/GIS comprises a casing 1, a busbar cavity 14, adjustable impedors 11, first metal supports 6, second metal supports 8, a third metal support 9 and high-frequency current sensors 13.

The casing 1 is connected to the busbar cavity 14, a conductor 3 is arranged in the busbar cavity 14, and the busbar cavity 14 is provided with multiple air vents 5, wherein the conductor 3 is used for transmitting current.

The first metal supports 6 and the second metal supports 8 are arranged at grounding points of the busbar cavity 14 and are separated by insulating supports 7, and the adjustable impedors 11 are connected in series between the first metal supports 6 and the second metal supports 8 through wires 12. One end of the third metal support 9 is connected to the second metal supports 8, and the other end of the third metal support 9 is connected to a grounding grid.

The high-frequency current sensors 13 are disposed around the wires 12. Specifically, the high-frequency current sensors 13 are disposed around the wires 12 located at the grounding points and connected with the adjustable impedors 11, and are configured to measure a high-frequency current signal generated by partial discharge.

Optimally, the adjustable impedors 11 are connected in series between the first metal supports 6 and the second metal supports 8 at two grounding points at two ends of the busbar cavity 14 to simulate housing lengths, on two sides of the cavity, extended by a value equivalent to the impedance of the adjustable impedors 11; and the high-frequency current sensors 12 are arranged at positions shown in FIG. 1 to obtain the propagation characteristics of high-frequency current in a long-distance GIL/GIS. The propagation of high-frequency current in the long-distance GIL/GIS can be simulated by controlling the impedance and number of the adjustable impedors.

Figure 2:
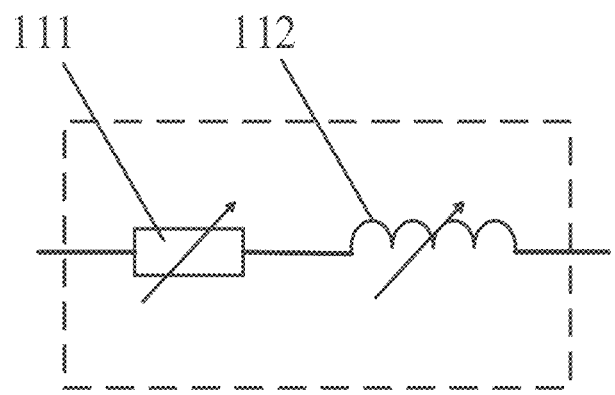
FIG. 2 is a structural view of an adjustable impedor in the device for simulating high-frequency current propagation of partial discharge of a GIL/GIS according to an embodiment of the application.

In some embodiments of the application, referring to FIG. 2, each of the adjustable impedors 11 is formed by an adjustable resistor 111 and an adjustable inductor 112 which are connected in series, wherein the adjustable resistor 111 is connected to the corresponding first metal support 6, the adjustable inductor 112 is connected to the corresponding second metal support 8. Specifically, one end of the adjustable resistor 111 is connected to the corresponding first metal support 6, the other end of the adjustable resistor 111 is connected to one end of the adjustable inductor 112, the other end of the adjustable resistor 112 is connected to the corresponding second metal support 8, the resistance of the adjustable resistor ranges from 0 to 5 Ω, and the inductance of the adjustable inductor ranges from 0 to 5 μH.

In some embodiments of the application, the casing 1 and the busbar cavity 14 are connected through a flange 2.

In some embodiments of the application, the busbar cavity 14 comprises multiple air chambers.

In some embodiments of the application, insulators 4 are arranged at joints of the air chambers to separate the air chambers.

In some embodiments of the application, the air vents 5 are formed in side faces of the air chambers respectively.

In some embodiments of the application, the casing 1 is connected to a partial discharge-free power-frequency testing transformer to supply power to the device.

In some embodiments of the application, multiple pulleys 10 are arranged at the bottom of the third metal support 9.

In some embodiments of the application, the adjustable resistors 111 are non-wire-wound potentiometers, the resistance of which is changed by rotating potentiometer shafts.

In some embodiments of the application, the adjustable inductors 112 are coils with a variable core position, the inductance of which is changed by adjusting the core position.

As can be known from the above technical solution, the device for simulating high-frequency current propagation of partial discharge of a GIL/GIS disclosed by the application comprises the casing, the busbar cavity, the adjustable impedors, the first metal supports, the second metal supports, the third metal support and the high-frequency current sensors. The first metal supports are separated from the second metal supports by the insulating supports, one end of the third metal support is connected to the second metal supports, the other end of the third metal support is connected to the grounding grid, each of the adjustable impedors is formed by the adjustable resistor and the adjustable inductor which are connected in series, and the adjustable impedors are connected in series between the first metal supports and the second metal supports through the wires. In the application, the adjustable impedors are connected in series to the metal supports at the grounding points to obtain an impedance equivalent to that of an impedor of a long-distance GIL/GIS housing. When partial discharge happens in the busbar cavity, high-frequency current passes through the adjustable impedors, which is equivalent to passing through a GIL/GIS housing with a length equivalent to the impedance of the impedors, thus fulfilling the purpose of simulating high-frequency current propagation of partial discharge of a long-distance GIL/GIS. The simulation process is simple and quick, and time and costs are reduced.

In actual application, first, insulation defects are set in the busbar cavity 14. Second, the position and number of grounding points are selected, the adjustable impedors 11 are connected in series between the first metal supports 6 and the second metal supports 8 through the wires 12, the first metal supports 6 and the second metal supports 6 at the grounding points are not connected through wires and keep disconnected. Third, a vacuum pump is connected to the air vents of the device to vacuumize the device, and then SF6 gas is introduced into the device. Fourth, the partial discharge-free power-frequency testing transformer is connected to the casing to pressurize the device. Fifth, a high-frequency current signal is measured by the high-frequency current sensors. Six, a power supply is turned off, the impedance is regulated to simulate the propagation of high-frequency current in a GIL/GIS, and the fourth step and the fifth step are repeated.

The application is described in detail above in conjunction with specific embodiments and illustrative examples, but these descriptions should not be construed as limitations of the application. Those skilled in the art should appreciate that various equivalent substitutions, modifications or improvements can be made to the technical solutions and embodiments of the application without departing from the spirit and scope of the application, and all these equivalent substitutions, modifications or improvements should fall within the scope of the application. The protection scope of the application should be defined by the appended claims.

What is claimed is:

1. A device for simulating high-frequency current propagation of partial discharge of a GIL/GIS, comprising a casing (1), a busbar cavity (14), an adjustable impedor (11), a first metal support (6), a second metal support (8), a third metal support (9), and a high-frequency current sensor (13), wherein:

the casing (1) is connected to the busbar cavity (14), a conductor (3) is arranged in the busbar cavity (14), and the busbar cavity (14) is provided with multiple air vents (5);

the first metal support (6) and the second metal support (8) are arranged at a grounding point of the busbar cavity (14) and are separated from each other by an insulating support (7), and the adjustable impedor (11) is connected in series between the first metal support (6) and the second metal support (8) through a wire (12); the third metal support (9) has one end connected to the second metal support (8) and another end connected to a grounding grid;

the high-frequency current sensor (13) is disposed around the wire (12).

2. The device for simulating high-frequency current propagation of partial discharge of a GIL/GIS according to claim 1, wherein the adjustable impedor (11) is formed by an adjustable resistor (111) and an adjustable inductor (112) which are connected in series, the adjustable resistor (111) is connected to the first metal support (6), and the adjustable inductor (112) is connected to the second metal support (8).

3. The device for simulating high-frequency current propagation of partial discharge of a GIL/GIS according to claim 1, wherein the casing (1) and the busbar cavity (14) are connected through a flange (2).

4. The device for simulating high-frequency current propagation of partial discharge of a GIL/GIS according to claim 1, wherein the busbar cavity (14) comprises multiple air chambers.

5. The device for simulating high-frequency current propagation of partial discharge of a GIL/GIS according to claim 4, wherein insulators (4) are arranged at joints of the air chambers.

6. The device for simulating high-frequency current propagation of partial discharge of a GIL/GIS according to claim 1, wherein the air vents (5) are formed in side faces of air chambers.

7. The device for simulating high-frequency current propagation of partial discharge of a GIL/GIS according to claim 1, wherein the casing (1) is connected to a partial discharge-free power-frequency testing transformer.

8. The device for simulating high-frequency current propagation of partial discharge of a GIL/GIS according to claim 1, wherein multiple pulleys (10) are arranged at a bottom of the third metal support (9).

9. The device for simulating high-frequency current propagation of partial discharge of a GIL/GIS according to claim 2, wherein the adjustable resistor (111) is a non-wire-wound potentiometer.

10. The device for simulating high-frequency current propagation of partial discharge of a GIL/GIS according to claim 2, wherein the adjustable inductor (112) is a coil with a variable core position.

* * * * *